United States Patent [19]

Uematsu et al.

[11] Patent Number: 4,916,503
[45] Date of Patent: Apr. 10, 1990

[54] PHOTO-ELECTRIC CONVERTING DEVICE

[75] Inventors: Tsuyoshi Uematsu, Koganei; Tadashi Saitoh, Tokyo; Yasuhiro Kida, Hitachi, all of Japan

[73] Assignee: Hitachi, Ltd., Tokyo, Japan

[21] Appl. No.: 216,537

[22] Filed: Jul. 8, 1988

[30] Foreign Application Priority Data

Jul. 8, 1987 [JP] Japan .................. 62-168645

[51] Int. Cl.$^4$ .................. H01L 27/14
[52] U.S. Cl. .................. 357/30
[58] Field of Search .................. 357/30 D, 30 H, 30 J, 357/30 Q, 55

[56] References Cited

U.S. PATENT DOCUMENTS 3,377,215  4/1968  Carter .................. 357/30 H
3,812,518  5/1974  Kurz et al. .................. 357/30 D

OTHER PUBLICATIONS

IEEE Photovolatic Specialists Conference, (1985), pp. 424–429.

Primary Examiner—Martin H. Edlow
Attorney, Agent, or Firm—Fay, Sharpe, Beall, Fagan, Minnich & McKee

[57] ABSTRACT

A photo-electric converting device has a plurality of emitters with a non-circular or non-dot shape in order to improve the photo-electric converting efficiency. The distance between the adjacent emitters has a predetermined relation to the average diffusion length of the minority carriers in a base layer in order to further improve the photo-electric conversion efficiency. The device is formed to have groove structures to restrain the photo-electric conversion loss due to reflected light.

36 Claims, 7 Drawing Sheets

PHOTO-ELECTRIC CONVERTING DEVICE

BACKGROUND OF THE INVENTION

1. Field of the Invention

This invention relates to a photo-electric converting device and more particularly to a photo-electric converting device having a structure which provides high photo-electric converting efficiency.

The photo-electric converting device in accordance with this invention includes photo-electric converting devices having a pn junction therein such as a solar cell, a photo-detecting device and the other photo diode.

2. Description of the Related Art

In order to increase the converting efficiency of a photo-electric converting device having a pn junction, it is efficient to relatively decrease a pn junction area in comparison with a device area. To this end, in the prior art, one of the semiconductors which constitute a pn junction was formed in the shape of plural dots so that its area is smaller than that of the other semiconductor, thereby relatively decreasing the pn junction area in comparison with the device area. The photo-electric converting device having such a structure has been proposed in an article in IEEE, Photovoltaic Specialists Conference (1985) pp. 424–429.

Meanwhile, it is critical for improving the photo-electric converting efficiency of the photo-electric converting device having a pn junction that minority carriers generated due to light absorption efficiently reach the pn junction.

However, in the prior art mentioned above, as shown in FIG. 1, since emitters 12 are formed on a base layer 11 in the shape of plural dots to decrease the pn junction area, the minority carriers optically generated in a base layer can not effectively reach the pn junction unless the interval between the emitters are sufficiently smaller than the diffusion length of the minority carriers. However, if the emitter interval is decreased, the electrodes 13 which are provided on an emitter layer to collect the current from the emitters 12 must also be decreased in their interval and width. Thus, the prior art has a problem to be solved that it is difficult to form the electrodes with a high accuracy.

SUMMARY OF THE INVENTION

It is an object of the present invention to provide a photo-electric converting device having a high photo-electric converting efficiency.

In accordance with one aspect of the present invention, a photo-electric converting device with high photo-electric converting efficiency is provided. Such a photo-electric converting device comprises first semiconductor regions of a first conductivity type, a second semiconductor region of a second conductivity type for converting incident light into carriers, an electrode connected with the first semiconductor regions, for externally extracting the current produced by the carriers, wherein the shape of the first semiconductor region is substantially longer in the vertical direction and shorter in the parallel direction with respect to the connection parts of the electrode with the first semiconductor regions.

In accordance with a more limited aspect of the present invention, a photo-electric converting device with high carrier collection efficiency is provided. Such a photo-electric converting device requires that the distance c between the two adjacent first semiconductor regions of the plural first semiconductor regions is twice or preferably a half or less than the diffusion length of the minority carriers in the second semiconductor regions.

In accordance with another aspect of the present invention, there is provided a photo-electric converting device comprising first plural semiconductor regions of a first conductivity type, a second semiconductor region of a second conductivity type for converting incident light into carriers, and electrodes for externally extracting the current produced by the carriers, wherein the effective region in the plane receiving the incident light is covered with plural carrier travelling regions residing within the distance d from each of the first semiconductor regions and the distance d is approximately equal to or less than the diffusion length of the minority carriers in the second semiconductor region. More preferably, the distance d is approximately one-fourth or less than the diffusion length of the minority carriers. If the entire area of the carrier travelling regions enclosed within the distance d from the first semiconductor regions is 80% or more (preferably 90% or more) than the effective region in the surface receiving the incident light, the photo-electric converting efficiency is held extremely high.

One advantage of the present invention is that the high carrier collection efficiency leads to a photo-electric converting device with high photo-electric converting efficiency.

Another advantage of the present invention is that sufficient clearance is designing the electrode interval makes it easy to form the electrodes in a photo-electric converting device.

Still another advantage of the present invention is that the reduction in shadowing loss by the electrodes increases the photo-electric converting efficiency in a photo-electric converting device.

Still further advantages of the present invention will become apparent to those of ordinary skill in the art upon reading and understanding the following detailed description of the preferred embodiments.

BRIEF DESCRIPTION OF THE DRAWINGS

The invention may take from in various parts and arrangements of parts or in various steps and arrangements of steps. The drawings are only for purposes of illustrating the preferred embodiments and are not to be construed as limiting the invention.

DESCRIPTION OF THE PREFERRED EMBODIMENTS

Figure 2A:
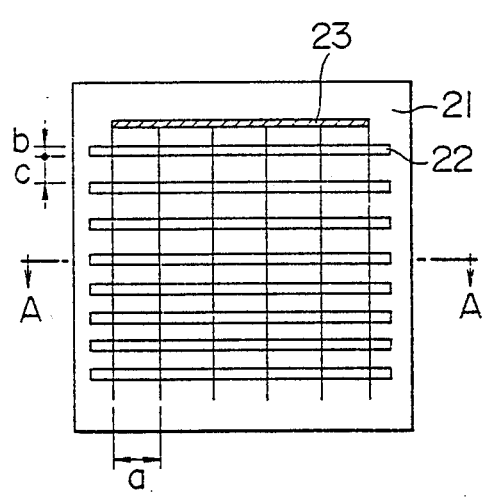
FIGS. 2A, 2B and 2C are views for explaining a photo-electric converting device according to one embodiment of the present invention.
Figure 2B:
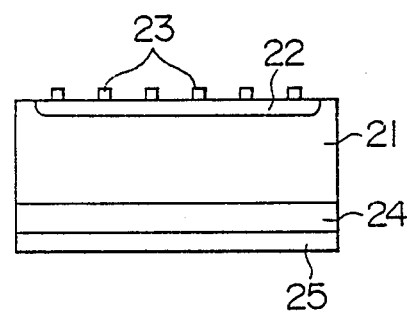
Figure 2C:
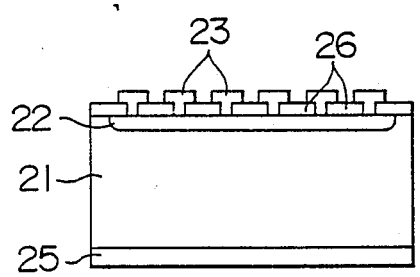

With reference to FIGS. 2A, 2B and 2C, the structure of a photo-electric converting device in accordance with the present invention will be explained. In this structure, emitters 22 are formed in a rectangular or stripe shape on a base layer 21 and electrodes 23 are formed to traverse thereover. The width b of the emitters 22 is set to be one-third or less than the distance c between the adjacent emitters, thereby improving the output voltage by several tens of mV. If the width b is set to be one-tenth or less than the distance c, the increase in the output voltage at least twice that obtained in the case of the width b being one-third the distance c. The distance c between the adjacent emitters is set to be approximately twice or less than the diffusion length of the minority carriers, thereby preventing the minority carrier collection efficiency from being decreased. If the distance c is set to preferably a half or less than the diffusion length of the minority carriers, the decrease in the collection efficiency can be substantially completely prevented. The diffusion length of the minority carriers is several tens to several hundreds of $\mu$m for e.g. a silicon wafer made by a floating zone (FZ) melting technique. For a silicon wafer made by the Czochralski (CZ) process technique, it is about a half or one-third thereof. The minority carrier diffusion length in the base layer used in a photo-electric converting device can be 20 to 400 $\mu$m, or further, 30 to 300 $\mu$m. This diffusion length can be optionally set by an impurity concentration and the other fabricating conditions. In this structure, the electrode interval a in FIG. 2A can be freely selected regardless of the width b and the distance c which satisfy the above condition. Thus, the allowance in designing the electrode arrangement is increased, thereby providing a desired photo-electric converting device with high photo-electric converting efficiency. Additionally, the emitter shape needs not be in a rectangular or stripe shape but may be a curve shape. Also, as shown in FIG. 4, the emitters may be separated in the vicinity of the middle between the adjacent electrodes.

Figure 4:
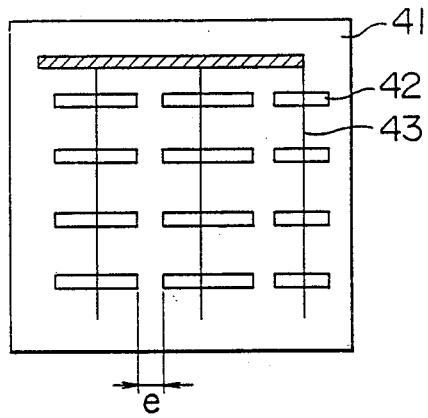
FIGS. 4 to 7 are plan views of photo-electric converting devices according to other embodiments of the present invention.

In FIG. 4, the interval e between the adjacent emitter regions 42 having different electrode branches 43 is desired to be not greater than twice (more preferably one-half) the minority carrier diffusion length in a base region 41 like the distance c in FIG. 2A. The minority carriers in the base region are holes or electrons depending upon whether the conduction type of the base region is an n-type or p-type.

Figure 1:
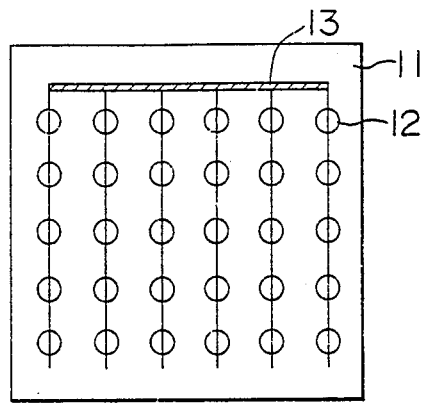
FIG. 1 is a plan view of a photo-electric converting device according to the prior art.
Figure 5:
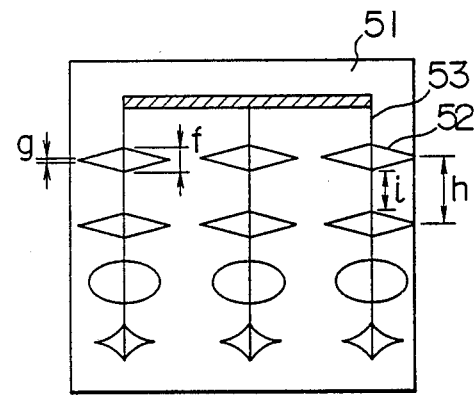

As mentioned above, the emitter shape needs not be in a rectangular or stripe shape, but may be in a triangle, elliptical or other shape or a curve. Also, various shapes of emitters 52 may be simultaneously provided on the base region 51 in the same device as shown in FIG. 5. Three kinds of emitter 52 shapes shown in FIG. 5. These shapes are reduced in width in the vicinity of the middle between the adjacent branch electrodes 53. This is because the current flowing through each emitter is smaller at a farther position from the branch electrode 53 so that even if the emitter width at this position is reduced, the power loss is not so large. Thus, with minimum power loss, the emitter area can be further reduced. As for the emitter width and interval in this case, the average of the width f of the emitter 52 in the vicinity of the branch electrode and the effective width g thereof in the vicinity of the tip of the emitter is desired to be no greater than one-third (more preferably one-tenth) the average of the intervals h and i between the adjacent emitters 52 in the direction of the branch electrode. The longest distance between the adjacent emitters 52 is desired to be no greater than twice (more preferably a half) the minority carrier diffusion length. For the reasons mentioned above, the emitter 52 length in the direction perpendicular to the branch electrode is longer than the width in the direction in parallel to the branch electrode. In contrast, the prior art emitter, as shown in FIG. 1, has its length and width equal. Incidentally, the branch electrode is referred to as the electrode portion directly electrically connected with each emitter region.

In the prior art emitter 12 shape as shown in FIG. 1, a smaller emitter interval requires a smaller branch electrode interval. However, with the emitter shape of the present invention as mentioned above, even if the interval between the adjacent emitters is twice not greater than the diffusion length of the minority carriers in the base region, the interval between the adjacent branch electrodes traversing them may take a larger value than that between the adjacent emitters. Thus, the number of the branch electrodes can be reduced, thereby decreasing the shadowing loss.

In the above explanation, the emitter shape was longer in the direction perpendicular to the branch electrode. However, that direction may be oblique to the branch electrode (although in this case the power loss or the reduction of the fill factor may occur since the distance along which the carriers flow in the emitter is longer than the case where the emitter shape is longer in the direction perpendicular to the branch electrode).

Figure 6:
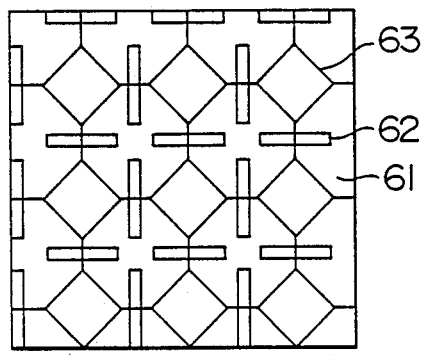
Figure 7:
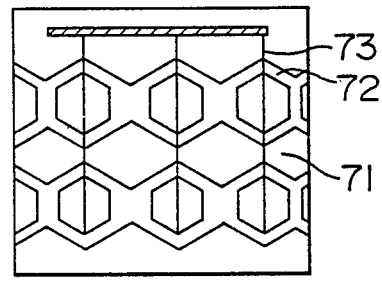

The two adjacent emitters 62 need not be in parallel to each other, but may be formed on a base region 61 so as to be longer in the direction perpendicular to a polygonal electrode branch 63 as shown in FIG. 6. As shown in FIG. 7, emitters 72 may be formed in the combination of polygons, in a lattice shape or in a concentric circle shape. It is essential that the emitters 72 are formed on the base layer 71 to be longer in the direction perpendicular to a branch electrode 73 in the direction parallel thereto. It should be noted that if the emitters 72 are arranged in a bridge-like structure as shown in FIG. 7, the electrode branches 73 or emitters 72 are not left as islands when they are partially cut, which assures that current can be extracted through the other paths that are not cut.

Figure 3A:
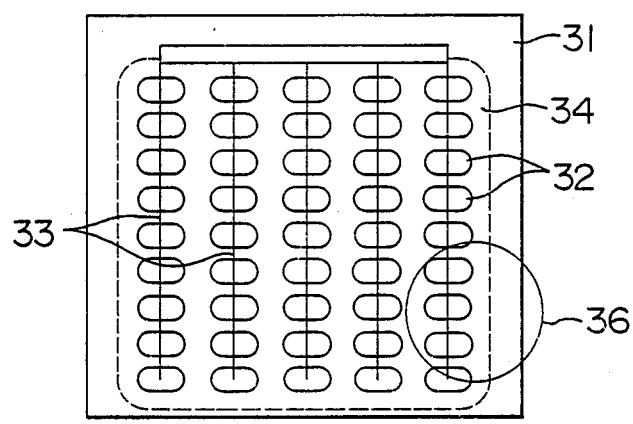
FIGS. 3A, 3B and 3C are a plan view and partially enlarged views of a photo-electric converting device according to another embodiment of the present invention.
Figure 3B:
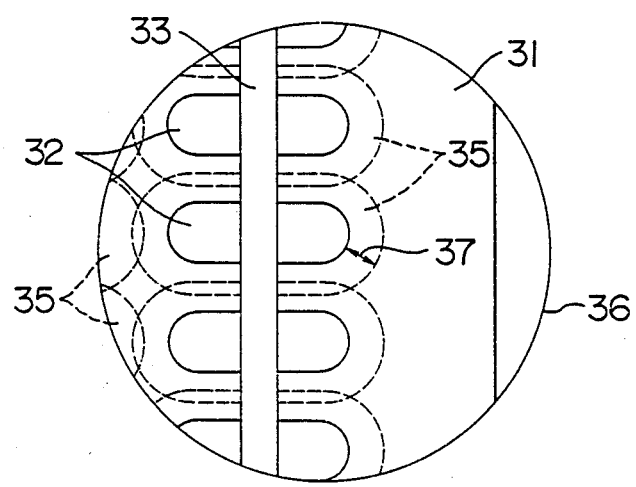
Figure 3C:
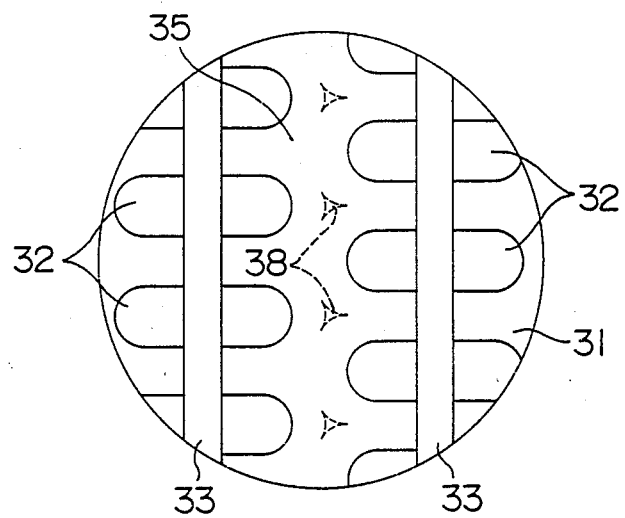

With reference to FIGS. 3A, 3B and 3C, the structural features of a photo-electric converting device in accordance with the present invention will be explained in detail.

FIG. 3A is a top plan view of a photo-electric converting device in accordance with the present invention in which a plurality of first semiconductor regions (emitters) 32 of a first conductivity type (n-type or p-type) are formed on a second semiconductor region (base layer) 31 of a second conductivity type and an electrode including branch electrodes 33 for taking electrical connection with the respective emitters 32 are arranged. Each emitter 32 is formed in an elliptical shape but it may be formed in the other shapes as mentioned above. It is essential and indispensable to the present invention that the emitters 32 each having a shape longer in the direction perpendicular to the branch electrode 33. The upper surface of the photo-electric converting device as shown in FIG. 3A constitutes an incident light receiving surface. However, as apparent to those skilled in the art, the region which actually serves to photo-electrically convert the incident light within the device (more correctly within the base layer 31) is smaller in area than the incident light receiving surface. This region is referred to an effective region. The effective region is indicated by the region 34 enclosed by a broken line. As previously mentioned, the distance between the adjacent emitters 32 is desired no greater than twice (more preferably a half) the diffusion length of the minority carriers in the base layer 31. In other words, the emitters 32 are desired to be arranged so that the effective region of the upper surface of the base layer 31 is covered with the area enclosed by the distance of the substantial diffusion length (hereinafter referred to as "d") of the minority carriers in the base layer 31, more preferably d/4. FIG. 3B is an enlarged view of a portion 36 (enclosed by a circle) of the photo-electric converting device shown in FIG. 3A. The like reference numerals in FIG. 3B refer to like parts in FIG. 3A. The broken line around each emitter 32 refers to the position where the distance 37 from each emitter 32 resides at the diffusion length d of the minority carriers in the base layer 31. In a preferred embodiment of the present invention, the regions 35 enclosed by the broken line in FIG. 3B are desired to be at least 80% (more preferably 90%) of the effective region of the photo-electric conversion mentioned above. It is essential for improving the photo-electric convertion efficiency that this condition relative to the effective region is satisfied and also the distance 37 from the emitter 32 is no greater than d, more preferably d/4.

Moreover, in order to cover the above effective region and also reduce the pn junction areas formed by the emitters and the base regions, as shown in FIG. 3C, the emitters 32 electrically connected with the corresponding branch electrodes 33 are staggered in relation to the adjacent branch electrodes, thereby further improving the photo-electric conversion efficiency. Triangle regions 38 enclosed, by broken lines in FIG. 3C, indicate the portions separated from any of the emitters 32 by at least the distance d. The structure suitable to minimize the area of such portions 38 is shown in FIG. 3C.

Figure 8:
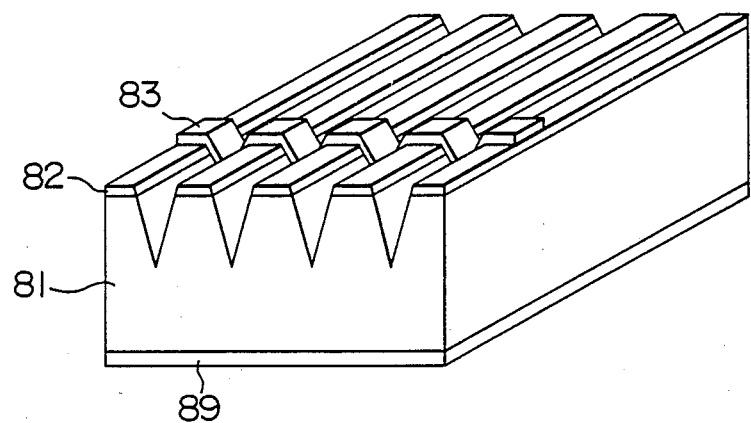
FIG. 8 is a perspective view of the photo-electric converting device in accordance with the present invention implemented as a structure having a groove structure.

In the above explanation, the emitter shape when the device is seen from above has been described. When groove structures are provided on the device surface, the emitters having the shape mentioned above are formed on only the convex portions of these grooves, thereby providing a photo-electric converting device with further enhanced photo-electric conversion efficiency. One example of such a device is shown in FIG. 8. This device having groove structures provides an excellent surface reflection preventing effect.

The device is different from that in the embodiments previously in that groove structures are formed on the incident light receiving surface of the device. The groove structures, even when incident light is reflected on the device surface, serve to photo-electrically convert the reflected light. With these groove structures, the diffusion length d of the minority carriers as mentioned above is significant in the direction of the slopes of the grooves. The sectional shape of the groove structure is not limited to the V-groove as shown in FIG. 8, but may be a U-groove, semicircular groove, etc. which can also provide the effect relative to the reflected light. It should be noted that the sectional shape substantially equivalent to the V-groove is optimum to provide the above effect. Incidentally, these groove structures, after the emitter regions 82 are formed on a base layer 81, can be formed by means of machine work such as a ruling engine, photo-etching or other well known etching technique. Thereafter, electrodes 83 and 89 can be formed by means of a well known technique such as vapor deposition.

Several preferred embodiments of the present invention will be explained in detail.

EMBODIMENT 1

As shown in FIG. 2B, a p-type silicon is prepared as a base layer 21. After aluminum (Al) is vacuum-deposited on one surface of the base layer 21, the structure is annealed in an electric furnace to form a $p^+$-type silicon layer 24. This layer 24 serves to enhance the carrier collection efficiency but is not necessarily required in the present invention. An oxide film having a plurality of rectangular openings is formed on the surface of the base layer 21 opposite to the layer 24. Using this oxide film as a mask, phosphorus (P) is diffused into the base layer 21 through the openings by means of a well known thermal oxidation technique to form emitters 22. The arrangement of the emitters is shown in FIG. 2A. FIG. 2B is a sectional view taken on line A—A in FIG. 2A. The emitter width b is 3.5 $\mu$m long and the interval c between the adjacent two emitters is 50 $\mu$m long. The diffusion length of electrons which are the minority carriers in the base layer 21 is about 30 $\mu$m.

After the oxide film used as a diffusion mask is removed, using a mask having a desired shape, titanium (Ti) and thereafter silver (Ag) are deposited to form a front surface electrode 23. The width of the branch electrode portion is 20 $\mu$m long and the distance between the adjacent branch electrodes is 800 $\mu$m long. A back surface electrode 25 is formed by depositing Ti and Ag as in the above deposition without using a mask. Alternatively, as shown in FIG. 2C, the electrode 23 may be formed, after the emitters 22 are formed and the oxide film mask is removed, by forming an oxide film (about 15 nm thick) on the base layer 21 through e.g. the ordinary thermal oxidation technique, etching it into a desired shape using photoresist as a mask so as to form an oxide film 26 having contact grooves and thereafter forming the electrode 23 thereon through vapor deposition and lift-off techniques.

The photo-electric converting device in accordance with this embodiment exhibits high photo-electric conversion efficiency. The device having the emitter shape as shown in FIGS. 3A, 3C, 4, 5, 6 and 7 can also be fabricated in the same manner as mentioned above. Further, the conductivity type of the base layer 21 and of the emitter 22 may be inverted. In this case, the minority carriers in the base layer 22 are holes. But the difference in the diffusion length of electrons and holes is basically negligible. Thus, also in this case, the photo-electric converting device can be fabricated with the dimensions as mentioned above.

EMBODIMENT 2

Figure 9:
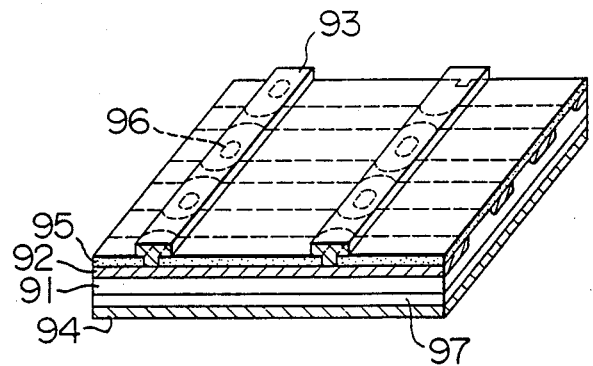
FIGS. 9 to 11 are perspective views showing other applications of the photo-electric converting device in accordance with the present invention.

Another embodiment of the present invention will be explained with reference to FIG. 9.

A p-type silicon is prepared as a base layer 91. A p+-type layer 97, after aluminum is vacuum-deposited on one surface of the base layer 91, is formed by annealing the structure in an electric furnace. Emitters 92 are formed by diffusing phosphorus, using an oxide film mask, into the base layer 91 through the ordinary thermal oxidation technique as in Embodiment 1. The emitter width is 4 μm and the distance between the adjacent emitters is 40 μm. An oxide film 95 which is 15 mm thick, after the oxide film mask is removed, is formed through the ordinary thermal oxidation technique. Contacts 96 are formed by etching away the oxide film 95 over the emitters 92 using a photo-resist mask. The contact size is 2 μm in diameter. Electrodes 93 are formed by depositing Ti 0.1 μm thick over the contacts 96 and Ag 2 μm thick thereon through the ordinary vacuum deposition technique and further through the lift-off technique. The electrode width is 20 μm and the electrode interval is 800 μm. An electrode 94 is formed by depositing Ti 0.1 μm thick on the p+-layer 97 and Ag 2 μm thick through the ordinary vacuum deposition technique. Also in this embodiment, several emitter shapes can be formed by changing the mask shape in making the emitters.

EMBODIMENT 3

Figure 10:
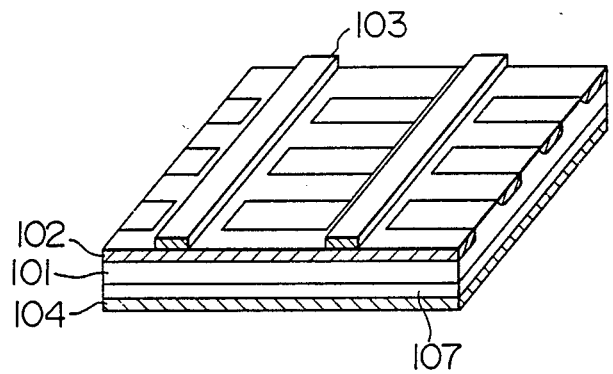

Still another embodiment of the present invention will be explained with reference to FIG. 10. A base 101 is prepared by a p-type silicon. A p+-type layer 107, electrodes 103 and an electrode 104 are formed in the same manner as in Embodiment 2 (FIG. 9). Emitters 102 are also formed in the same manner as in Embodiment 2, but its shape is different from the emitter 92 in FIG. 9 in that they are also formed below the entire electrodes 103 in addition to the shape shown in FIG. 9. In this embodiment, the oxide film 95 shown in FIG. 9 is not formed.

EMBODIMENT 4

A further embodiment of the present invention will be explained with reference to FIG. 11. A base 111 is prepared by a p-type silicon. A p+-type layer 117, electrodes 113 and an electrode 114 are formed in the same manner as in Embodiment 2 (FIG. 9). Emitters 112 are formed at the upper portions of the grooves, which are formed by the anisotropic etch of the p-type Si layer 111 using an oxide mask, by diffusing phosphorus into the base 111 using another oxide film mask. An oxide film 115, after the oxide film mask is removed, is formed over the grooves by thermal oxidation. Contacts 116 are formed in the same manner as in Embodiment 2.

Figure 11:
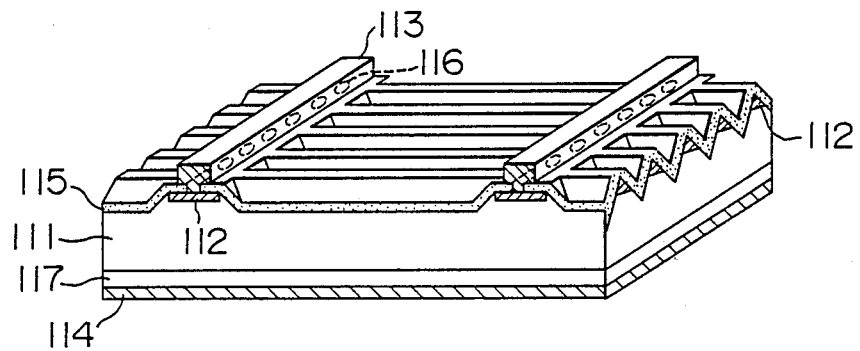

The process particularly efficient to form a device having groove structures as shown in FIG. 11 will be explained below.

Figure 12A:
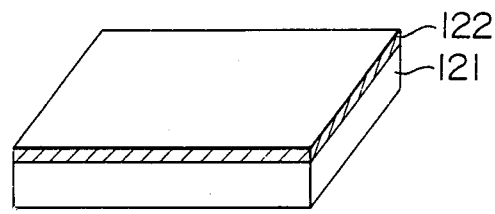
FIGS. 12A, 12B, 13A, 13B, 14 and 15 are views showing the process of fabricating the photo-electric converting device in accordance with the present invention.
Figure 12B:
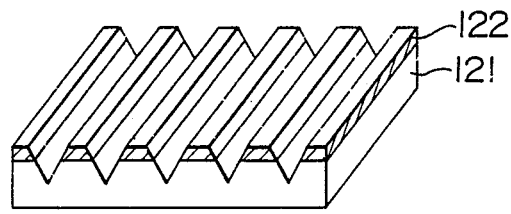

The method for forming groove structures for preventing the reflection of incident light on a device surface includes, as mentioned above, first fabricating the base layer of a second conductivity tape semiconductor in groove structures and thereafter forming the emitters of a first conductivity type semiconductor. This method, in order to form the emitters at the upper portions of the groove structures as shown in FIG. 12B, requires a step of diffusion using an oxide film mask, etc. which gives rise to increase of the number of process steps and difficulty in the photolithography technique. On the other hand, as shown in FIG. 12A, if an emitter layer 122 is formed on the entire surface of a semiconductor layer (base) 121 and the emitter layer 122 and the base layer 121 are partially removed through e.g. etching, the emitters can be easily formed at the upper portions of the groove structures (FIG. 12B). Also, an alignment process between the emitter shape and that of the upper portion of the groove structure is not required.

Figure 13A:
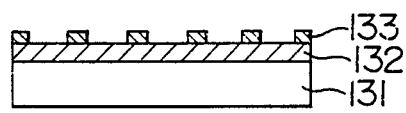
Figure 13B:
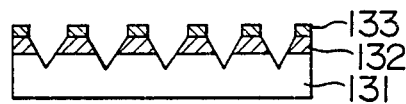

The structure mentioned above is fabricated in the process as shown in FIGS. 13A and 13B. First, as shown in FIG. 13A, a resist pattern 133 is formed on an emitter layer 132 formed on a base layer 131. The resist pattern 133 can be formed through the ordinary photolithography technique, printing technique, etc. By etching the emitter layer 132 and the base layer 131, the device structure as shown in FIG. 13B is obtained. This etching method includes the methods of using an anisotropy in the etching speed peculiar to a crystal in question (For example, a silicon crystal is etched, with its (100) plane placed on the surface, by etching using KOH, hydrazine, etc.), and other wet etching, dry etching, etc. The sectional shape of the groove may be a V-shape as shown in FIGS. 13A and 13B, or may be a U-shape and other shapes. It should be noted that the V-shape is most effective to prevent the surface reflection of incident light.

Figure 14:
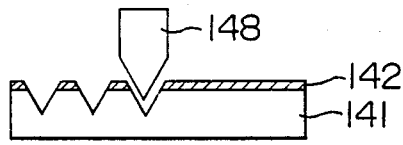

FIG. 14 illustrates a method of mechanically forming the groove structures as mentioned above. The grooves can be formed by cutting away an emitter layer 142 and a base layer 141 using a cutter 148 such as a ruling engine. The cutter 148 may be any kind of cutter which is capable of forming the groove structures such as a cutter using horizontal shift, a disk cutter using rotation, etc.

Figure 15:
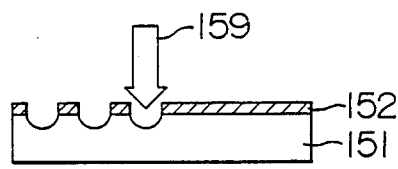

FIG. 15 illustrates a method of thermally forming the groove structure as mentioned above. Using a light flux 159, an emitter layer 152 and a base layer 151 are partially melted to form grooves. A laser beam is most suitable as the light flux but other light sources with a high luminance may be used.

In the above explanation, the groove structures are linearly formed but may be formed in several shapes including a curve, rectangle, circle, etc. The sectional shape of the groove may be a V-shape, U-shape, square shape or other shape.

Figure 16:
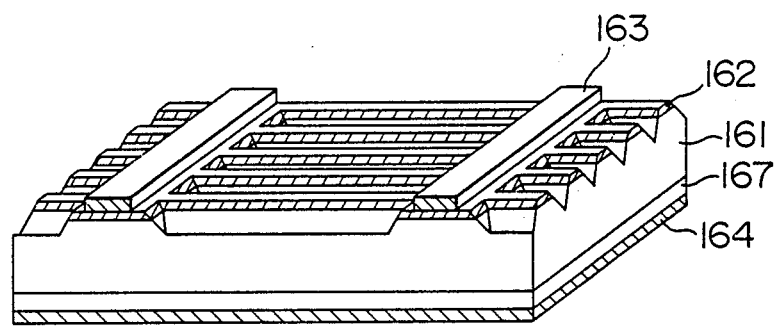
FIG. 16 is a perspective view of a photo-electric converting device according to a further embodiment of the present invention.

A still further embodiment of the present invention using the method mentioned above will be explained with reference to FIG. 16.

EMBODIMENT 5

A base 161 is prepared as a p-type silicon. Emitters 162 are formed as follows. An emitter layer is formed on the entire one surface of the base 161 by diffusing phosphorus into the base. An oxide film mask is deposited on the structure. The oxide film mask is left at only the positions corresponding to the emitters 162 through the ordinary photoresist technique and etching technique. Using this oxide film as a mask, anisotropic etching is performed to form V-shape grooves as well as linear emitters. A p+-type layer 167 is formed by depositing Al on the other surface of the base 161 by vacuum deposition, and heating the structure in an electric furnace. An electrode 164 is formed by vacuum deposition of Ti and Ag. Electrodes 163 are formed by vacuum deposition of Ti and Ag and the lift-off technique. The emitter width is 4 μm and the emitter interval is 40 μm. The electrode 163 width is 20 μm and the electrode 163 interval is 800 μm. The diffusion length of the electrons which are minority carriers in the base layer 161 is about 30 μm.

Additionally, in this embodiment, the opening angle of the V-shape groove is about 70° (2×arc sin (1/√3)°), but in the case of using a ruling engine, any opening angle may be used (an accute angle less than 90° is desired in view of the use efficiency of the reflected light.)

In these embodiments of the present invention described above, with the interval between the adjacent electrode branches being large, the emitter interval can be made as small as from several tens of μm to a few μm. Thus, the output voltage can be increased by e.g. several tens of mV without reducing the fill factor, thus improving the photo-electric conversion efficiency. The shadowing loss due to the electrodes can be held small.

The invention has been described with reference to the preferred embodiments. Obviously, modifications and alterations will occur to those of ordinary skill in the art upon reading and understanding the present specification. It is intented that the invention be construed as including all such alterations and modifications in so far as they come with the scope of the appended claims or the equivalent thereof.

We claim:

1. A photo-electric converting device comprising:
   a plurality of separate, spaced apart, elongated first semiconductor regions having a first conductivity type;
   a second semiconductor region having a second conductivity type, wherein the first semiconductor regions have direct contact with the second semiconductor region so as to form a plurality of pn junctions;
   a pair of electrodes, one of said electrodes has a plurality of spaced apart branch electrodes, and the branch electrodes intersect at right angles to the elongation of and at the intersections to the first semiconductor regions; and
   each of the first semiconductor regions has a shape longer in the direction perpendicular to the connected branch electrodes than in the direction in parallel thereto.

2. The device as set forth in claim 1, wherein the distance between the adjacent two first semiconductor regions is no greater than twice the diffusion length of minority carriers in the second semiconductor region.

3. The device as set forth in claim 1, wherein the first conductivity type is an n-type and the second conductivity type is a p-type.

4. The device as set forth in claim 1, wherein the first semiconductor region is made mainly of silicon crystal.

5. The device as set forth in claim 1, wherein the distance between the adjacent two first semiconductor regions is no greater than half the diffusion length of minority carriers in the second semiconductor region.

6. A photo-electric converting device having an incident light receiving surface, comprising:
   a plurality of separate, spaced apart first semiconductor regions having a first conductivity type;
   a second semiconductor region having a second conductivity type, wherein incident light is converted into carriers and the first semiconductor regions have direct contact with the second semiconductor region so as to form a plurality of pn junctions;
   a pair of electrodes, each of said electrodes having a plurality of spaced apart branch electrodes; and
   means forming the effective region of the incident areas within a distance L from each of said first semiconductor regions, and the distance L is no greater than the diffusion length of minority carriers in the second semiconductor region.

7. The device as set forth in claim 6, wherein each of the first semiconductor regions is elongated to have a shape longer in the direction perpendicular to the branch electrodes than in the direction in parallel thereto.

8. The device as set forth in claim 6, wherein the distance L is not larger than a quarter of the diffusion length of the minority carriers.

9. The device as set forth in claim 6, wherein said collection at least 80% of the effective region in the incident light receiving surface.

10. The device as set forth in claim 6, wherein the first conductivity type is an n-type and the second conductivity type is a p-type.

11. The device as set forth in claim 6, wherein the second semiconductor region has a plurality of grooves.

12. The device as set forth in claim 11, wherein the first semiconductor regions are formed on the convex portions of said grooves.

13. A device as set forth in claim 1, wherein said one of said electrodes is comb-shaped, with said branch electrodes being coplanar and parallel to each other.

14. A device as set forth in claim 1, wherein said first semiconductor regions are arranged coplanar with each other in columns of separate first semiconductor regions with each column being immediately adjacent a corresponding branch electrode to which its regions are connected, and further being arranged to be spaced apart from each other in rows orthogonal to said columns, with the regions of each row being connected respectively to the branch electrodes.

15. A device as set forth in claim 14, wherein the first semiconductor regions of one column are offset in the direction of said branch electrodes with respect to the first semiconductor regions of an adjacent column.

16. A device as set forth in claim 15, wherein said offset is equal to about ½ the spacing between adjacent first semiconductor regions of a column.

17. A device as set forth in claim 16, wherein the spacings between adjacent first semiconductor regions in the direction of said columns is uniform and the spacings between adjacent first semiconductor regions in the direction of said rows is uniform.

18. A device as set forth in claim 14, wherein the spacings between adjacent first semiconductor regions in the direction of said columns is uniform and the spacings between adjacent first semiconductor regions in the direction of said rows is uniform.

19. A device as set forth in claim 1, further including means forming the effective region of the incident light receiving surface to be covered with the collection areas within a distance L from each of said first semiconductor regions, and the distance L being no greater than the diffusion length of minority carriers in the second semiconductor region.

20. A device as set forth in claim 19, wherein the distance L is no larger than a quarter of the diffusion length of the minority carriers.

21. A device as set forth in claim 20, wherein said collection areas covers at least 80% of the effective region of the incident light receiving surface.

22. A device as set forth in claim 20, wherein the distance L is not larger than a quarter of the diffusion length of the minority carriers.

23. A device as set forth in claim 1, further including a plurality of parallel grooves extending into said second semiconductor region, each groove being between adjacent first semiconductor regions, and each groove being substantially open outwardly to receive incident light and provide means for reducing incident light reflection.

24. A device as set forth in claim 23, wherein said branch electrodes extend across and on top of each of said first semiconductor regions and said second semiconductor region within said grooves to follow the contour of said grooves.

25. A device as set forth in claim 1, wherein said first semiconductor regions are separated from each other and spaced apart in a direction perpendicular to said branch electrodes.

26. A device as set forth in claim 25, wherein each of said first semiconductor regions has a width, as measured in the direction of said branch electrodes, that is greatest immediately adjacent the connected branch electrode and has a minimum width at its opposed portions furtherest from said connected branch electrode.

27. A device as set forth in claim 1, wherein said branch electrodes are connected together in a plurality of connected polygons, to provide more than one direct electrical path between any two adjacent first semiconductor regions.

28. A device as set forth in claim 27, wherein said first semiconductor regions are arranged in elongated directions alternating in orthogonal orientation, and said branch electrodes include single connector portions connecting adjacent polygons and crossing a connected first semiconductor region at right angles to its direction of elongation, with said polygons being between first semiconductor regions.

29. A device as set forth in claim 1, wherein said first semiconductor regions are arranged in connected polygonal shape.

30. A device as set forth in claim 1, wherein each of said first semiconductor regions is bisected, in the direction of elongation, by its connected branch electrode.

31. A device as set forth in claim 7, wherein each of said first semiconductor regions is bisected, in the direction of elongation, by its connected branch electrode.

32. A device as set forth in claim 14, wherein each of said first semiconductor regions is bisected, in the direction of elongation, by its connected branch electrode.

33. A device as set forth in claim 25, wherein each of said first semiconductor regions is bisected, in the direction of elongation, by its connected branch electrode.

34. A device as set forth in claim 26, wherein each of said first semiconductor regions is bisected, in the direction of elongation, by its connected branch electrode.

35. A device as set forth in claim 15, wherein each of said first semiconductor regions is bisected, in the direction of elongation, by its connected branch electrode.

36. A device as set forth in claim 18, wherein each of said first semiconductor regions is bisected, in the direction of elongation, by its connected branch electrode.

* * * * *